US009003262B2

(12) United States Patent
Lee et al.

(10) Patent No.: US 9,003,262 B2
(45) Date of Patent: Apr. 7, 2015

(54) MEMORY CONTROLLER, DEVICES INCLUDING THE SAME, AND OPERATING METHOD THEREOF

(75) Inventors: Jae-Wook Lee, Anyang-si (KR); Yang Sup Lee, Hwaseong-si (KR); Jeong Beom Seo, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 576 days.

(21) Appl. No.: 13/428,231

(22) Filed: Mar. 23, 2012

(65) Prior Publication Data
US 2012/0246540 A1 Sep. 27, 2012

(30) Foreign Application Priority Data
Mar. 24, 2011 (KR) ........................ 10-2011-0026205

(51) Int. Cl.
*G11C 29/42* (2006.01)
*G06F 12/02* (2006.01)
*G06F 11/10* (2006.01)
*G11C 29/54* (2006.01)
*H03M 13/05* (2006.01)

(52) U.S. Cl.
CPC ........ *G06F 12/0246* (2013.01); *G06F 11/1068* (2013.01); *H03M 13/05* (2013.01)

(58) Field of Classification Search
None
See application file for complete search history.

(56) References Cited

U.S. PATENT DOCUMENTS

| 2009/0083485 | A1 |   | 3/2009  | Cheng      |         |
|--------------|----|---|---------|------------|---------|
| 2009/0240873 | A1 |   | 9/2009  | Yu et al.  |         |
| 2010/0241914 | A1 | * | 9/2010  | Chen et al.| 714/718 |
| 2010/0313099 | A1 | * | 12/2010 | Yamaga     | 714/755 |
| 2010/0325524 | A1 | * | 12/2010 | Yang et al.| 714/773 |

FOREIGN PATENT DOCUMENTS

| JP | 2008-191701    | 8/2008 |
|----|----------------|--------|
| KR | 1020020000825  | 1/2002 |

* cited by examiner

*Primary Examiner* — April Y Blair
*Assistant Examiner* — Dipakkumar Gandhi
(74) *Attorney, Agent, or Firm* — Ellsworth IP Group PLLC (57) ABSTRACT

An operating method of a memory controller includes classifying a plurality of blocks in a memory cell array included in a flash memory into a first group and a second group according to the number of error bits in data programmed to each of the blocks, and creating a combinational block by combining a first block from the first group with a second block from the second group.

20 Claims, 10 Drawing Sheets

MEMORY CONTROLLER, DEVICES INCLUDING THE SAME, AND OPERATING METHOD THEREOF

CROSS-REFERENCE TO RELATED APPLICATIONS

This application claims the benefit of priority under 35 U.S.C. §119(a) from Korean Patent Application No. 10-2011-0026205, filed on Mar. 24, 2011, in the Korean Intellectual Property Office, the disclosure of which is hereby incorporated by reference in its entirety.

BACKGROUND

1. Field of the Invention

The present general inventive concept generally relates to a memory controller, and more particularly, to a memory controller to use a bad block, devices including the same, and an operating method of the memory controller.

2. Description of the Related Art

Memory devices are largely divided into volatile memory devices and non-volatile memory devices.

Volatile memory devices have fast read and write speed but lose data stored therein when they are not powered. On the contrary, non-volatile memory devices retain data stored therein even when they are not powered. Accordingly, non-volatile memory devices are used to store data that needs to be retained regardless of the supply of power.

Examples of non-volatile memory devices are mask read-only memory (MROM), programmable read-only memory (PROM), erasable programmable read-only memory (EPROM), and electrically erasable programmable read-only memory (EEPROM).

In general, MROM, PROM, and EPROM do not allow data to be erased or written freely, and therefore, it is not easy to update data stored in MROM, PROM, and EPROM. Contrarily, EEPROM allows data to be electrically erased and written, and therefore, the application of EEPROM has been expanded for system programming requiring continuous update or for auxiliary memory. In particular, flash EEPROM has higher integration than EEPROM and is thus very advantageous in that it is used as large-capacity auxiliary memory.

Among flash EEPROM, NAND flash memory has much higher integration than NOR flash memory.

Non-volatile memory devices include a plurality of memory cells. Each of the memory cells stores one or more bits. There has been a trend toward high integration, large capacity, and high performance of non-volatile memory devices with the increase of chip size. However, this trend accompanies the decrease in the circuit line width, the increase of the number of processes, and the increase of complexity with respect to non-volatile memory devices. These conditions lead the reduction of yield of chips. To overcome this problem, non-volatile memory devices include a redundant memory cell for replacing a defective memory cell.

In addition, non-volatile memory devices also include means for translating an address of a defective cell into an address of a redundant memory cell. When a bad block including a defective cell is detected during a test operation, the bad block is replaced by a redundant block.

As the bad block is replaced by the redundant block, a non-volatile memory device including the bad block can be released as a fair-quality product. However, since the number of redundant blocks included in a single non-volatile memory device is limited, it may happen that the number of bad blocks that have been detected exceeds the number of redundant blocks.

SUMMARY

The present general inventive concept provides a memory controller to use a combinational block created by logically combining a bad block and a good block, devices including the same, and an operating method of the memory controller.

Additional features and utilities of the present general inventive concept will be set forth in part in the description which follows and, in part, will be obvious from the description, or may be learned by practice of the general inventive concept.

The foregoing and/or other features and utilities of the present general inventive concept may be realized by an operating method of a memory controller. The operating method includes classifying a plurality of blocks of a memory cell array included in a flash memory into a first group and a second group according to a number of error bits in data programmed to each of the blocks, and creating a combinational block by combining a first block from the first group with a second block from the second group.

The operating method may further include scrambling and programming data to be stored in the combinational block.

The operating method may further include descrambling and reading scrambled data from the combinational block.

The operating method may further include programming a part of first data to the first block of the combinational block and the remaining of the first data to the second block of the combinational block, and programming a part of second data to the first block of the combinational block and the remaining of the second data to the second block of the combinational block.

The operating method may further include splitting the combinational block up when an average number of error bits per block in data stored in the combinational block exceeds a reference value.

Features and/or utilities of the present general inventive concept may also be realized by a memory controller including a processor configured to process information about a number of error bits in each of a plurality of blocks in a memory cell array included in a flash memory, and a combinational block manager configured to classify the plurality of blocks into a first group and a second group according to the information about the number of error bits and to create a combinational block by combining a first block from the first group with a second block from the second group.

The memory controller may further include a flash management controller configured to control a program operation or a read operation of each of the blocks. The processor may control the flash management controller to scramble and store data in the combinational block.

The processor may control the flash management controller to program a part of first data to the first block of the combinational block and the remaining of the first data to the second block of the combinational block, and to program a part of second data to the first block of the combinational block and the remaining of the second data to the second block of the combinational block.

The combinational block manager may split the combinational block up when an average number of error bits per block in data stored in the combinational block exceeds a reference value.

The combinational block manager may include a grade determiner configured to classify the plurality of blocks into the first group and the second group according to the number of error bits in each of the plurality of blocks, a block selector configured to select the first block from the first group and the second block from the second group, and a combinational block creator configured to create the combinational block by combining the first block with the second block. Either of the first and second blocks may be a bad block.

Features and/or utilities of the present general inventive concept may also be realized by a solid state drive (SSD) including the above-described memory controller and an SSD controller configured to control the memory controller.

The SSD may further include a flash management controller configured to control each of the blocks in the memory cell array included in the flash memory. The processor may control the flash management controller to scramble and store data in the combinational block.

The combinational block manager may split the combinational block up when the average number of error bits per block in data stored in the combinational block exceeds a reference value.

Features and/or utilities of the present general inventive concept may also be realized by a memory card including an interface and the above-described memory controller connected between the interface and the flash memory.

Features and/or utilities of the present general inventive concept may also be realized by a memory controller connectable to a memory including a plurality of memory blocks, the memory controller including a block selector to select a first memory block having a number of error bits equal to or less than a predetermined value and to select a second memory block having a number of error bits greater than the predetermined value, and a combinational block creator to combine the first memory block and the second memory block to create a combinational memory block.

The memory controller may also include a combinational block error calculator to determine if the combinational memory block has an average number of error bits per block greater than the predetermined value.

If the combinational memory block has an average number of error bits per block greater than the predetermined value, the block selector may select a new first memory block having a number of error bits equal to or greater than the predetermined value and a new second memory block having a number of error bits less than the predetermined value, and the combinational block creator may combine the new first memory block and the new second memory block to create a new combinational memory block.

The memory controller may include an error correction code (ECC) block to correct errors in the plurality of memory blocks, wherein the predetermined value is based on a number of bits the ECC block is capable of correcting in a memory block.

BRIEF DESCRIPTION OF THE DRAWINGS

The above and other features and/or utilities of the present general inventive concept will become apparent and more readily appreciated from the following description of the embodiments, taken in conjunction with the accompanying drawings of which.

DETAILED DESCRIPTION

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
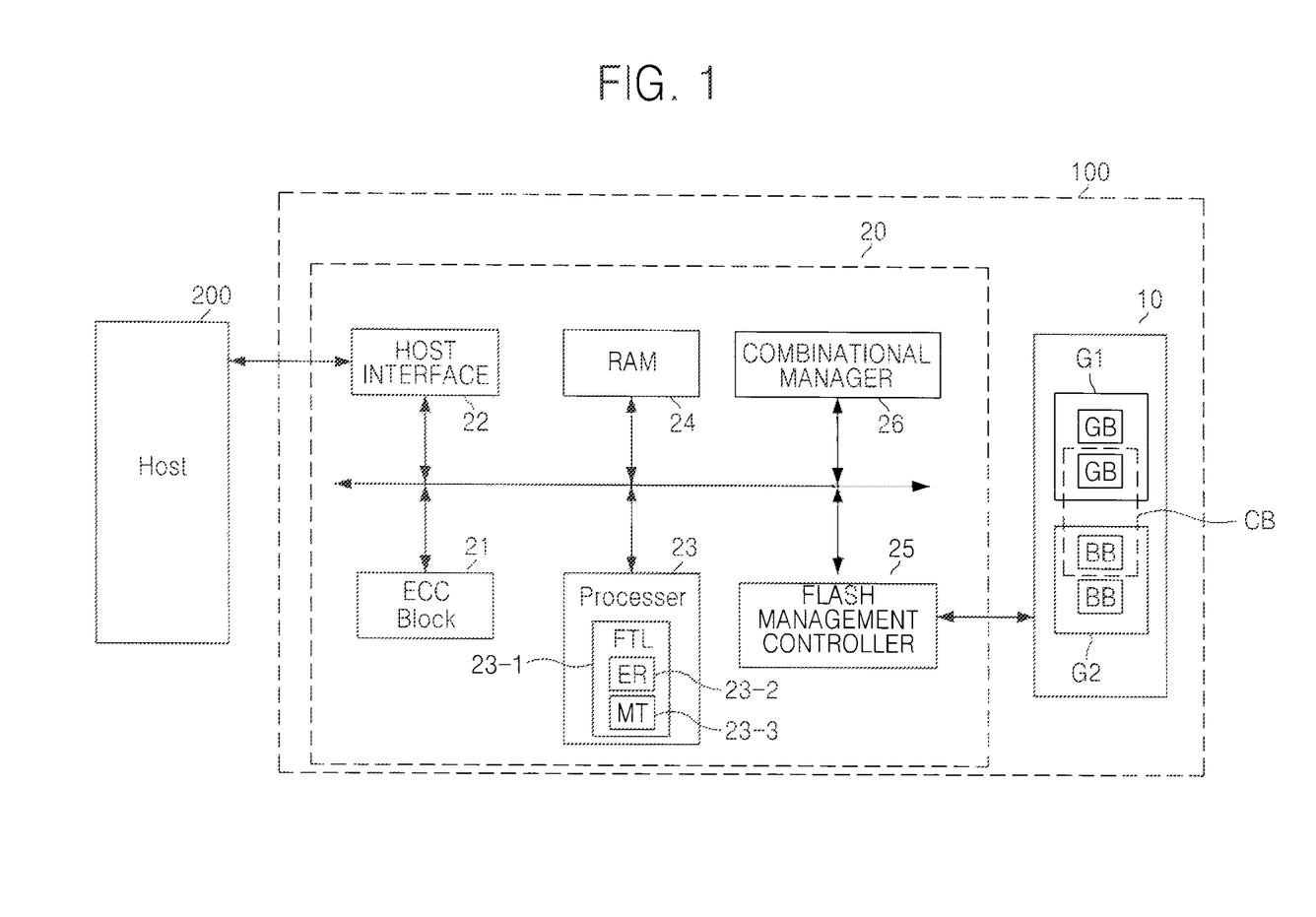
FIG. 1 is a block diagram of a non-volatile memory system according to an exemplary embodiment of the present general inventive concept.

FIG. 1 is a block diagram of a non-volatile memory system 100 according to an exemplary embodiment of the present general inventive concept. Referring to FIG. 1, the non-volatile memory system 100 includes a flash memory 10 and a memory controller 20. For clarity of the description, a host 200 is also illustrated in FIG. 1.

The flash memory 10 includes a plurality of blocks in a memory cell array (not shown).

The blocks in the flash memory 10 may be classified into a first group G1 and a second group G2 by the memory controller 20. For instance, the first group G1 may include at least one good block GB and the second group G2 may include at least one bad block BB. The memory controller 20 also combines, for example, logically combines, at least one good block GB and at least one bad block BB, thereby creating at least one combinational block CB. In other words, the memory controller 20 may recognize the combinational block CB as one data storage space.

A good block GB is a block storing data that has errors which can be corrected by an error correction code (ECC) block 21. A bad block BB is a block storing data that has error bits beyond the error correction capability of the ECC block 21.

Bad blocks BB in the flash memory 10 are not used because error bits in data stored in the bad blocks BB cannot be corrected by the ECC block 21, or the errors are beyond the error correction capability of the ECC block 21.

However, since the combinational block CB according to the current embodiments of the present general inventive concept includes a bad block BB and a good block GB, the average number of error bits per block of data stored in the combinational block CB is lower than the number of error bits in the bad block BB. Accordingly, the ECC block 21 may correct error bits in the data stored in the combinational block CB.

A method of logically creating the combinational block CB will be described in detail with reference to FIGS. 2 through 4 later. The flash memory 10 is a non-volatile memory and may be implemented by a NAND flash memory, which includes a plurality of memory cells storing one or more bits.

The memory controller 20 controlling the flash memory 10 includes the ECC block 21, a host interface 22, a processor 23, a random access memory (RAM) 24, a flash management controller 25, and a combinational block manager 26.

The host interface 22 may be implemented as a circuit or logic and interfaces data or commands between the non-volatile memory system 100 and the host 200. The host interface 22 may be, for example, a serial advanced technology attachment (SATA) interface, a parallel advanced technology attachment (PATA) interface, a universal serial bus (USB) interface, a peripheral component interconnect express (PCI-Express) interface, or a serial attached SCSI (SAS) interface.

The processor 23 may be implemented as a circuit, a logic, a code, or a combination thereof. The processor 23 controls the operations of the ECC block 21, the host interface 22, the RAM 24, the flash management controller 25, and the combinational block manager 26.

The ECC block 21 may be implemented as a circuit, a logic, a code, or a combination thereof. According to the control of the processor 23, the ECC block 21 detects error bits in data read from the flash memory 10 and corrects errors with respect to the detected error bits. Data may be stored in the flash memory 10 together with an ECC, i.e., ECC data.

The ECC data is used to correct at least one error bit included in data read from the flash memory 10 in a read operation. The number of error bits that can be corrected using the ECC data is limited. Error bits occurring in the read operation may be corrected using error detection technology and error correction technology.

The ECC block 21 generates ECC data for data transmitted from the host 200 in a write operation. The ECC block 21 also examines ECC data for data transmitted to the processor 23 in the read operation. When an error bit is detected in the data transmitted to the processor 23, the ECC block 21 corrects the error bit in the data and generates error-corrected data. The ECC block 21 transmits the error-corrected data to the processor 23.

The processor 23 may include a flash translation layer (FTL) 23-1 or execute it. The FTL 23-1 is software enabling the flash memory 10 to be used as a data storage medium and is executed by the processor 23. The FTL 23-1 includes error information (ER) 23-2 to manage the bad blocks BB and a mapping table (MT) 23-3 to translate a logical address into a physical address.

The flash memory 10 includes a cell array, which includes a plurality of blocks. Each of the blocks includes a plurality of pages. Each of the pages includes a plurality of memory cells.

A block is a basic unit of an erase operation. A page is a basic unit of a read or write (or program) operation. The ER 23-2 includes information about the number of error bits in each block, the number of error bits in each of the pages included in the block, and a position of each error bit.

Whenever the flash management controller 25 accesses the flash memory 10, the ECC block 21 transmits the ER 23-2 of the flash memory 10 to the FTL 23-1. The ER 23-2 may be updated by the FTL 23-1 and stored in the flash memory 10 during a power-off operation.

Each of the blocks in the flash memory 10 includes a plurality of pages. Each of the pages includes a spare region which stores ECC data and the ER 23-2.

The RAM 24 temporarily stores data received from the host 200 or data to be transmitted to the host 200. The RAM 24 also temporarily stores data that has been processed or will be processed by the processor 23. The RAM 24 may be implemented by a high-speed memory such as static RAM (SRAM) or a dynamic RAM (DRAM).

The flash management controller 25 may be implemented as a circuit, a logic, a code, or a combination thereof. The flash management controller 25 may control an operation of programming data to the flash memory 10, an operation of reading data from the flash memory 10, or an operation of erasing data from each of the blocks in the flash memory 10.

When a bad block BB occurs in the flash memory 10, the bad block BB is replaced with a redundant block. However, when there is no redundant block that can replace the bad block BB in the flash memory 10, the combinational block manager 26 combines, for example, logically combines, the bad block BB with a good block GB, thereby creating a combinational block CB. The structure and the operations of the combinational block manager 26 will be described in detail with reference to FIG. 2.

Figure 2:
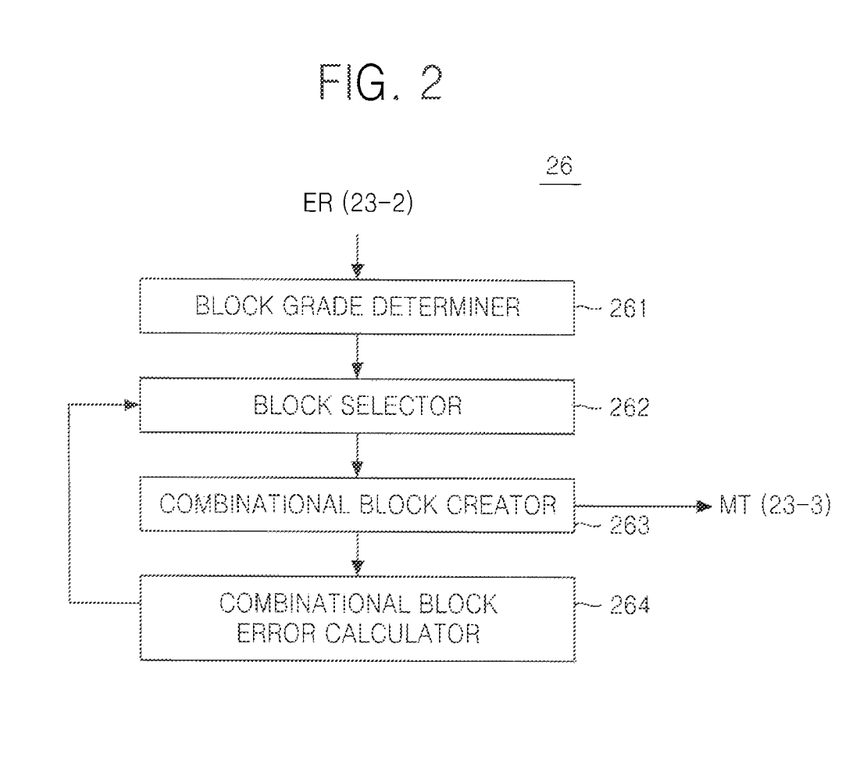
FIG. 2 is a detailed block diagram of a combinational block manager illustrated in FIG. 1.

FIG. 2 is a detailed block diagram of the combinational block manager 26 illustrated in FIG. 1. Referring to FIGS. 1 and 2, the combinational block manager 26 includes a block grade determiner 261, a block selector 262, a combinational block creator 263, and a combination block error calculator 264.

The block grade determiner 261 receives the ER 23-2 from the processor 23. The ER 23-2 includes information on the number of error bits in each of the blocks of the flash memory 10. The block grade determiner 261 classifies the blocks in the flash memory 10 into the first group G1 and the second group G2 according to the number of error bits in each of the blocks. For example, the first group G1 includes at least one good block GB and the second group includes at least one bad block BB. The block grade determiner 261 also determines the grade of each of the blocks classified into the first group G1 and the second group G2 according to the number of error bits in each of the blocks, as shown in Tables 1 and 2 below.

For instance, in a case where the number of error bits for distinguishing a good block GB from a bad block BB is 20, when the number of error bits in data stored in a block exceeds 20, the block is classified as a bad block BB. When the number of error bits in data stored in a block is equal to or less than 20, the block is classified as a good block GB. The number of error bits for classifying each block into the first or second group G1 or G2 may be set to a fixed value.

Table 1 shows the grades of a good block GB classified into the first group G1 according to the number of error bits.

TABLE 1

| Number of error bits in each block | Grades |
| --- | --- |
| 0 bits | G5 |
| 1~5 bits | G4 |
| 6~10 bits | G3 |
| 11~15 bits | G2 |
| 16~20 bits | G1 |

Table 2 shows the grades of a bad block BB classified into the first group G2 according to the number of error bits.

TABLE 2

| Number of error bits in each block | Grades |
| --- | --- |
| 41~45 bits | B5 |
| 36~40 bits | B4 |
| 31~35 bits | B3 |
| 26~30 bits | B2 |
| 21~25 bits | B1 |

The block selector 262 may select one block from the first group G1 and one block from the second group G2.

For instance, to create a combinational block CB, the block selector 262 selects a good block GB having the G5 grade and a bad block BB having the B1 grade. At this time, as illustrated in Tables 1 and 2, the sum of error bits in the good block GB having the G5 grade and error bits in the bad block BB having the B1 grade is a maximum of 25 bits.

The total number of error bits in the combinational block CB is the maximum of 25 bits, but the average number of error bits per block included in the combinational block CB is less than 13 bits.

At this time, it is assumed that part of write data is stored in the bad block BB having the B1 grade and the remaining of the write data is stored in the good block GB having the G5 grade.

In this case, error bits will occur only in the part of the write data stored in the bad block BB. As such, the number of error bits in the write data becomes the average of the number of error bits in the good block GB and the bad block BB, thus reducing the number of error bits in the write data as compared with when the write data is all written to the bad block BB. In other words, write data written to the combinational block CB (i.e., scrambled between a good block GB and bad block BB) has a lower number of error bits than write data written only to a bad block BB. The combinational block CB created by the combinational block manager 26 will be described in detail with reference to FIG. 3A through FIG. 4 later.

The combinational block creator 263 combines, for example, logically combines, at least one good block GB and at least one bad block BB, which are selected by the block selector 262, with each other to create a combinational block CB. At this time, the combinational block creator 263 transmits address information of the good and bad blocks GB and BB selected by the block selector 262 to the MT 23-3.

As illustrated in FIG. 1, the FTL 23-1 includes the MT 23-3 for access to each of the blocks in the flash memory 10. The FTL 23-1 updates the MT 23-3 using the address information of the good and bad blocks GB and BB, which are transmitted from the combinational block creator 263.

The combination block error calculator 264 measures or calculates the number of error bits in data stored in a combinational block CB. Additional error bits may occur in data stored in a good block GB or a bad block BB included in the combinational block CB. When the number of additional error bits exceeds the number of error bits that can be corrected by the ECC block 21 (i.e., a reference value), the combination block error calculator 264 cancels the creation of the combinational block CB.

Figure 3A:
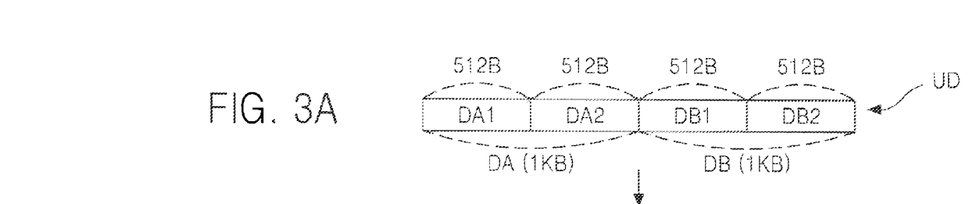
FIGS. 3A through 3E are conceptual diagrams of the operations of the combinational block manager illustrated in FIGS. 1 and 2.
Figure 3B:
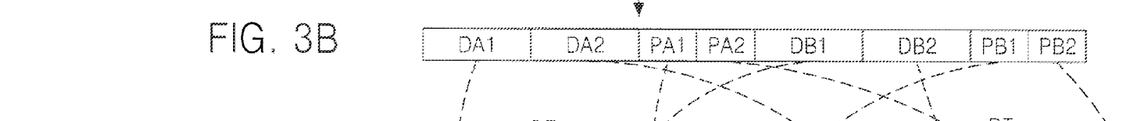
Figures 3C, 3D, 3E:
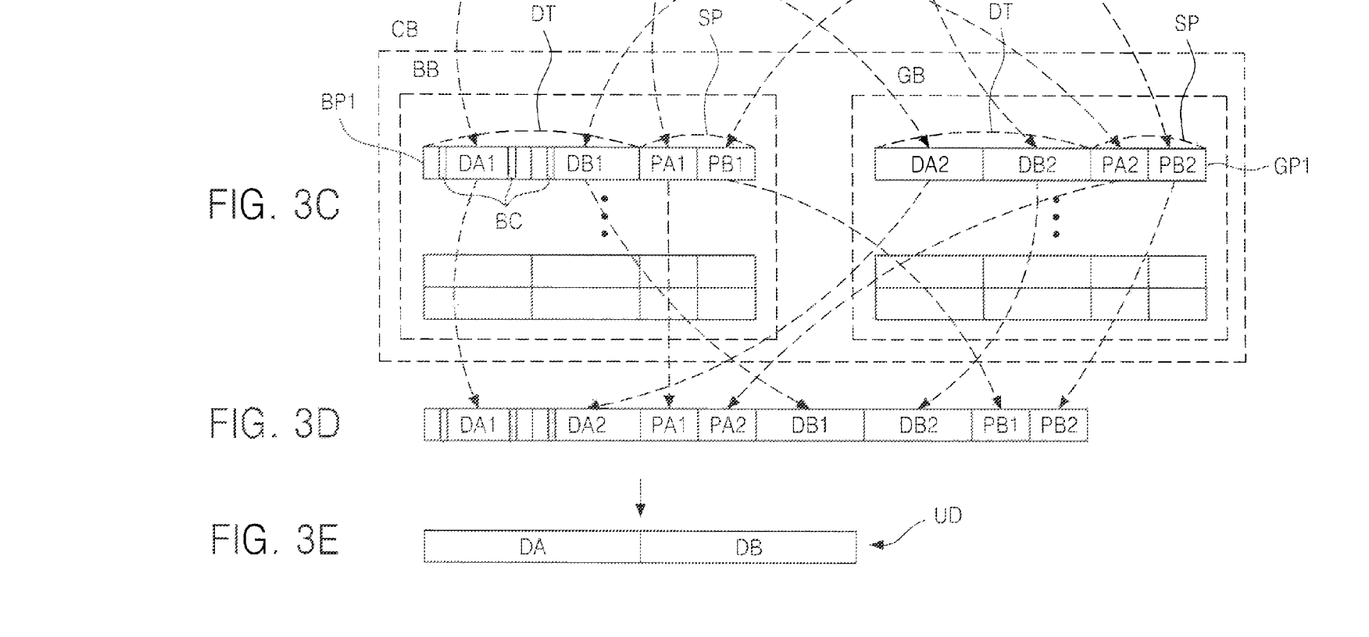

FIGS. 3A through 3E are conceptual diagrams of the operations of the combinational block manager 26 illustrated in FIGS. 1 and 2. Referring to FIGS. 1, 2 and 3C, a combinational block CB includes a single good block GB and a single bad block BB. It is assumed that a page buffer for storing data to be programmed to each of the good blocks GB and bad blocks BB has a size of 1 Kbyte. In other words, a first page BP1 corresponding to the bad block BB and a first page GP1 corresponding to the good block GB each have a size of 1 Kbyte. Although pages having a size of 1 Kbyte are illustrated and described with respect to FIGS. 3A through 3E, the present general inventive concept is not limited thereto.

FIG. 3A shows a user data UD to be stored in the combinational block CB.

The user data UD has a size of 2 Kbytes. The user data UD includes first data DA and second data DB. The first data DA includes 512 bytes of first sub data DA1 and 512 bytes of second sub data DA2. The second data DB includes 512 bytes of third sub data DB1 and 512 bytes of fourth sub data DB2. The host 200 may transmit the user data UD to the memory controller 20.

The ECC block 21 generates an ECC with respect to the user data UD.

For instance, as illustrated in FIG. 3B, the ECC block 21 generates first ECC data PA1 which is an ECC for the first sub data DA1, second ECC data PA2 which is an ECC for the second sub data DA2, third ECC data PB1 which is an ECC for the third sub data DB1, and fourth ECC data PB2 which is an ECC for the fourth sub data DB2.

The flash management controller 25 programs the user data UD to the combinational block CB. For instance, as illustrated in FIG. 3C, the flash management controller 25 programs the first sub data DA1, the third sub data DB1, the first ECC data PA1, and the third ECC data PB1 to the first page BP1 of the bad block BB according to the control of the FTL 23-1.

The first page BP1 includes a data region DT storing the first sub data DA1 and the third sub data DB1 and a spare region SP storing the first ECC data PA1 and the third ECC data PB1.

The flash management controller 25 also programs the second sub data DA2, the fourth sub data DB2, the second ECC data PA2, and the fourth ECC data PB2 to the first page GP1 of the good block GB according to the control of the FTL 23-1. The first page GP1 includes a data region DT storing the second sub data DA2 and the fourth sub data DB2 and a spare region SP storing the second ECC data PA2 and the fourth ECC data PB2.

In other words, the flash management controller 25 scrambles and programs the user data UD to the combinational block CB according to the control of the FTL 23-1.

The first page BP1 of the bad block BB includes at least one bad cell BC. For instance, the first page BP1 of the bad block BB may include a bad cell BC at a location where the first sub data DA1 is stored and a bad cell BC at a location where the third sub data DB1 is stored. Accordingly, when each of the first and third sub data DA1 and DB1 is read from the first page BP1 of the bad block BB, at least one error bit is included in each of the first and third sub data DA1 and DB1.

The flash management controller 25 reads the user data UD from the combinational block CB. For instance, as illustrated in FIG. 3D, the flash management controller 25 reads the first sub data DA1, the third sub data DB1, the first ECC data PA1, and the third ECC data PB1 from the first page BP1 of the bad block BB according to the control of the FTL 23-1.

Simultaneously, the flash management controller 25 reads the second sub data DA2, the fourth sub data DB2, the second ECC data PA2, and the fourth ECC data PB2 from the first page GP1 of the good block GB according to the control of the FTL 23-1. At this time, according to the control of the FTL 23-1, the flash management controller 25 descrambles the user data UD that has been scrambled and programmed to the combinational block CB when reading the user data UD.

It is assumed that error bits occur only in the first and third sub data DA1 and DB1. The ECC block 21 corrects error bits in the first sub data DA1 using the first ECC data PA1 and corrects error bits in the third sub data DB1 using the third ECC data PB1.

A bad cell BC exists only in the bad block BB. However, the user data UD is scrambled and programmed to the bad block BB and the good block GB in the scrambled state and descrambled when it is read. Accordingly, an error bit caused by the bad cell BC may occur in any of the first and second data DA and DB.

Since the user data UD is scrambled when it is programmed and descrambled when it is read, as illustrated in FIG. 3E, error bits can be corrected by the ECC block 21.

Figure 4:
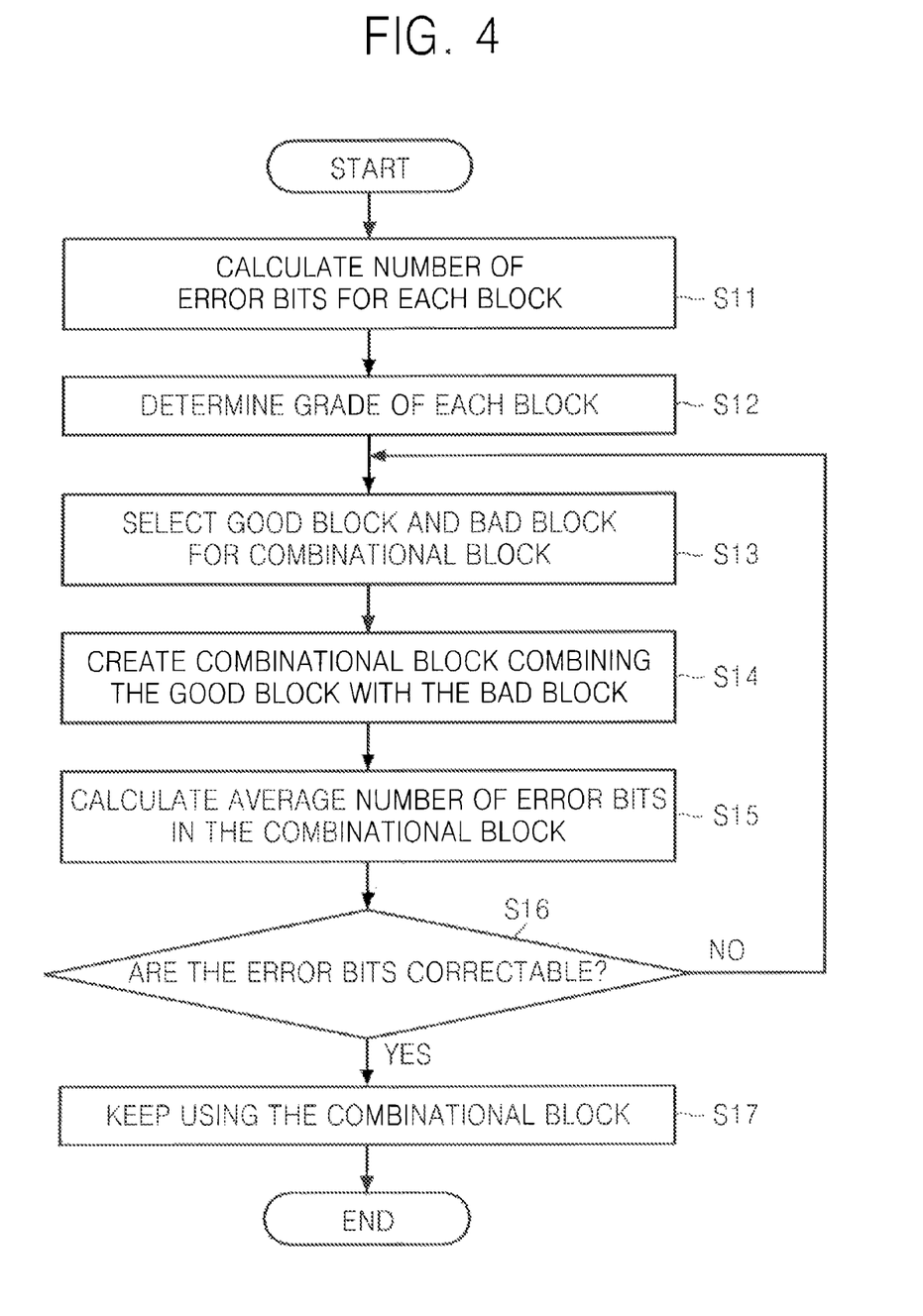
FIG. 4 is a flowchart of the operations of the combinational block manager illustrated in FIG. 1.

FIG. 4 is a flowchart of the operations of the combinational block manager 26 illustrated in FIG. 1. Referring to FIGS. 1 through 4, the block grade determiner 261 receives the ER 23-2 from the processor 23 and calculates the number of error bits for each block from the ER 23-2 in operation S11.

The block grade determiner 261 classifies the blocks in the flash memory 10 into the first group G1 and the second group G2 according to the number of error bits for each of the blocks and determines the grade of each block included in either of the first and second groups G1 and G2 in operation S12. The block selector 262 selects at least one good block GB from the first group G1 and at least one bad block BB from the second group G2 in operation S13

The combinational block creator 263 combines the at least one good block GB and the at least one bad block BB, which are selected by the block selector 262, with each other to create a combinational block CB in operation S14. The combination block error calculator 264 measures or calculates the average number of error bits per block of data stored in the combinational block CB in operation S15. The combination block error calculator 264 determines whether the error bits in the combinational block CB are correctable by the ECC block 21 in operation S16. For example, the combination block error calculator 264 may determine whether the average number of error bits per block of the combinational block CB is greater than or less than the number of error bits per block the ECC block 21 is capable of correcting.

When the error bits in the combinational block CB are correctable by the ECC block 21, the combinational block CB is kept to be used in operation S17. Otherwise, the combination block error calculator 264 splits the combinational block CB up.

Figure 5:
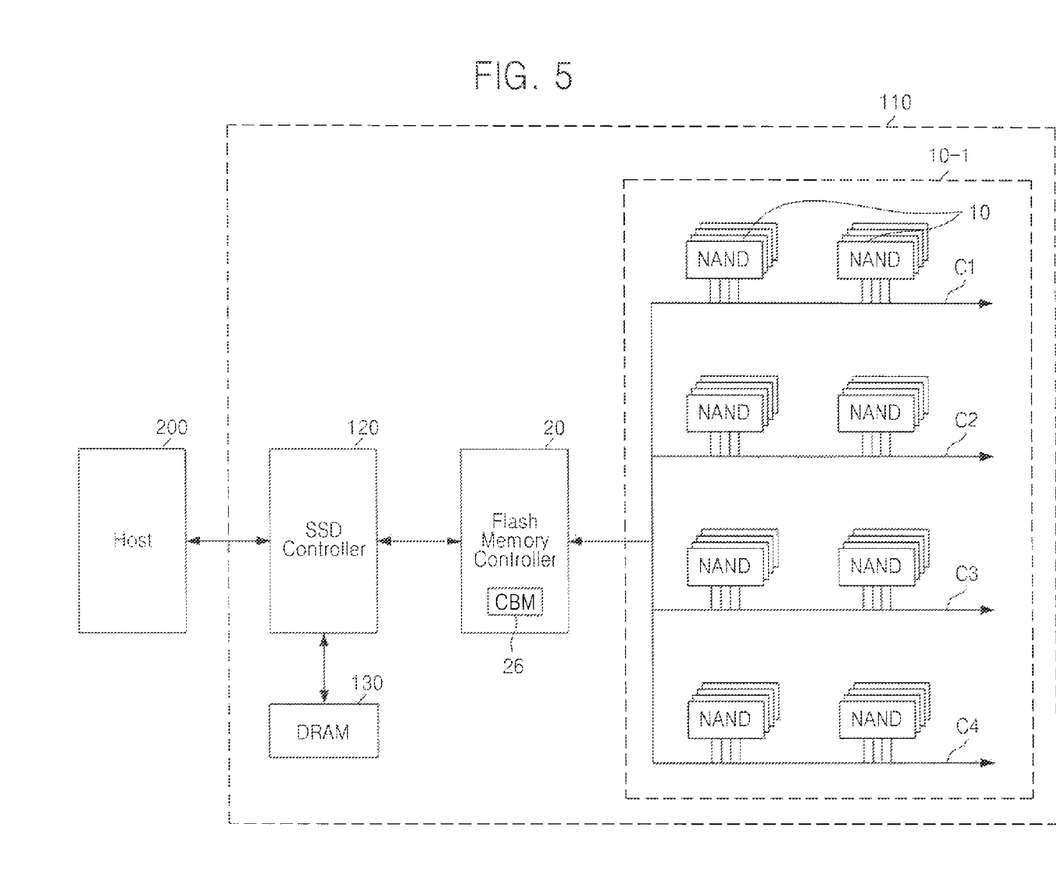
FIG. 5 is a diagram of a solid state drive including a memory controller illustrated in FIG. 1 according to an exemplary embodiment of the present general inventive concept.

FIG. 5 is a diagram of a solid state drive (SSD) 110 including the memory controller 20 illustrated in FIG. 1 according to an exemplary embodiment of the present general inventive concept. Referring to FIG. 5, the SSD 110 includes a non-volatile memory system 10-1, the memory controller 20 including the combinational block manager 26, a DRAM 130, and an SSD controller 120.

The non-volatile memory system 10-1 includes a plurality of non-volatile memories, e.g., flash memories 10, each of which is connected with any one of first through fourth channels C1, C2, C3, and C4. The memory controller 20 controls the operation of the non-volatile memory system 10-1. The SSD controller 120 stores data transmitted between the memory controller 20 and the host 200 in the DRAM 130.

The combinational block manager 26 may logically combine a good block GB in one of a plurality of flash memories 10 connected with the first channel C1 with a bad block BB in one of a plurality of flash memories 10 connected with the second channel C2 to create a combinational block CB. Alternatively, the combinational block manager 26 may logically combine a good block GB in one of the flash memories 10 connected with the first channel C1 with a bad block BB in another one of the flash memories 10 connected with the first channel C1 to create a combinational block CB.

Figure 6:
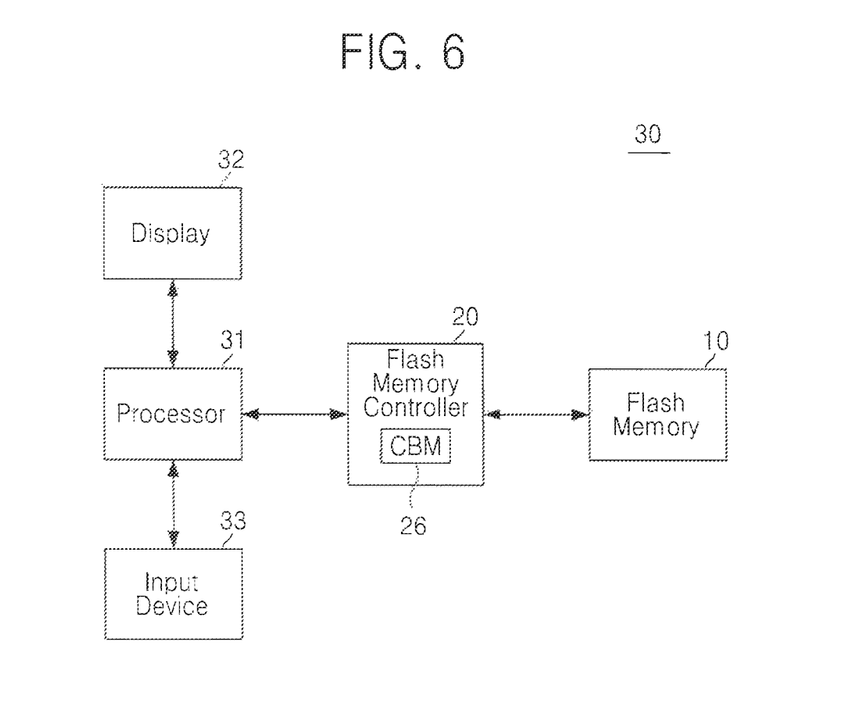
FIG. 6 is a diagram of a computer system including the memory controller illustrated in FIG. 1 according to an exemplary embodiment of the present general inventive concept.

FIG. 6 is a diagram of a computer system 30 including the memory controller 20 illustrated in FIG. 1 according to an exemplary embodiment of the present general inventive concept. Referring to FIG. 6, the memory controller 20 includes the combinational block manager 26. The computer system 30 including the memory controller 20 may be implemented as a personal computer (PC), a network server, a tablet PC, a netbook, an e-reader, a personal digital assistant (PDA), a portable multimedia player (PMP), an MP3 player, or an MP4 player.

The computer system 30 includes a processor 31, the flash memory 10, the memory controller 20 controlling the data processing operations of the flash memory 10, a display 32, and an input device 33.

The processor 31 may display data stored in the flash memory 10 through the display 32 according to data input through the input device 33. The input device 33 may be implemented by a pointing device such as a touch pad or a computer mouse, a keypad, or a keyboard. The processor 31 may control the overall operation of the computer system 30 and control the operations of the memory controller 20.

The memory controller 20, which may control the operations of the flash memory 10, may be implemented as a part of the processor 31 or as a separate chip.

Figure 7:
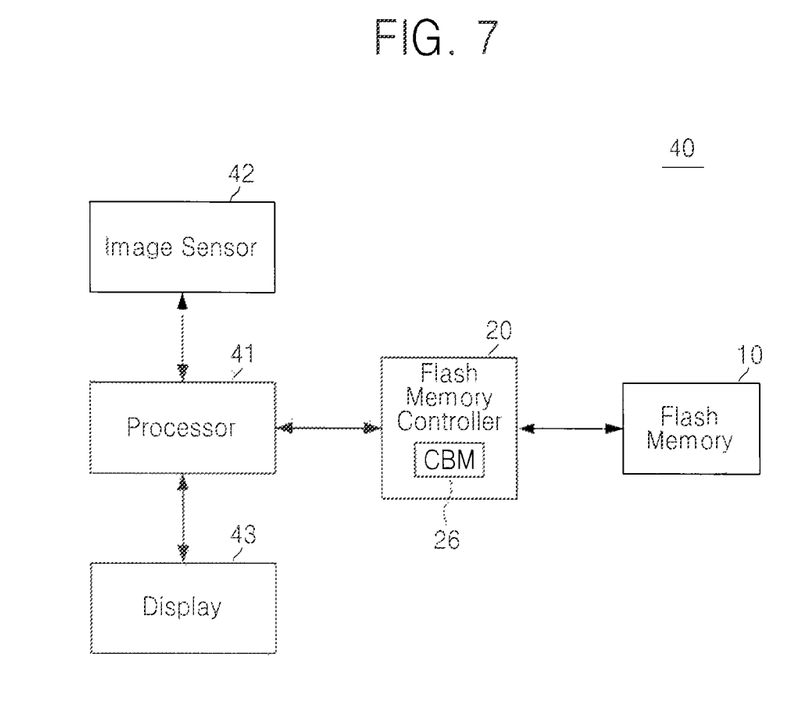
FIG. 7 is a diagram of a computer system including the memory controller illustrated in FIG. 1 according to an exemplary embodiment of the present general inventive concept.

FIG. 7 is a diagram of a computer system 40 including the memory controller 20 illustrated in FIG. 1 according to an exemplary embodiment of the present general inventive concept. Referring to FIG. 7, the memory controller 20 includes the combinational block manager 26. The computer system 40 including the memory controller 20 may be implemented as an image processing device like a digital camera or a cellular phone, a smart phone, or a tablet PC, which is equipped with a digital camera.

The computer system 40 includes the flash memory 10, the memory controller 20 controlling the data processing operation, such as an erase operation, a write operation, or a read operation, of the flash memory 10. The computer system 40 also includes a processor 41, an image sensor 42, and a display 43.

The image sensor 42 of the computer system 40 converts optical images into digital signals and transmits the digital signals to the processor 41 or the memory controller 20. The digital signals may be displayed through the display 43 or stored in the flash memory 10 through the memory controller 20 according to the control of the processor 41.

Data stored in the flash memory 10 may be displayed through the display 43 according to the control of the processor 41 or the memory controller 20. The memory controller 20, which may control the operations of the flash memory 10, may be implemented as a part of the processor 41 or as a separate chip.

Figure 8:
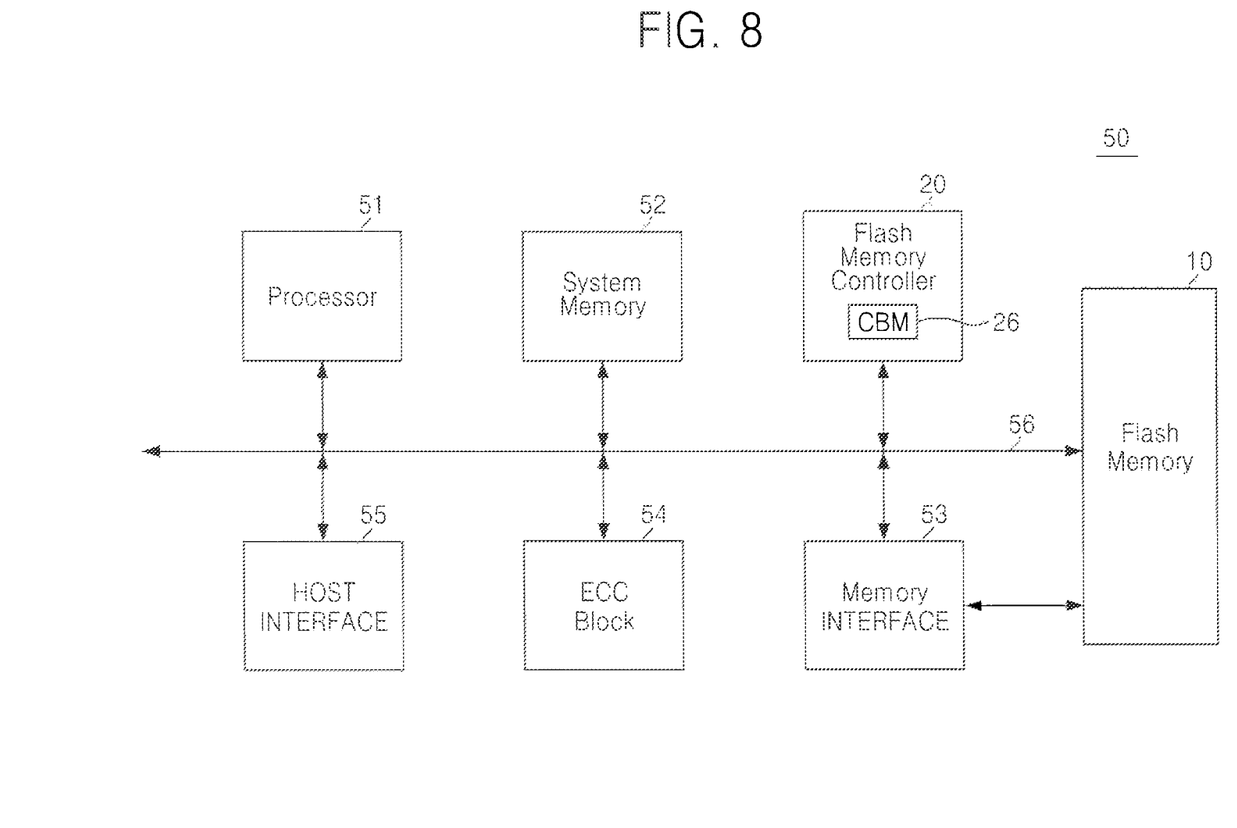
FIG. 8 is a diagram of a computer system including the memory controller illustrated in FIG. 1 according to an exemplary embodiment of the present general inventive concept.

FIG. 8 is a diagram of a computer system 50 including the memory controller 20 illustrated in FIG. 1 according to an exemplary embodiment of the present general inventive concept. Referring to FIG. 8, the memory controller 20 includes the combinational block manager 26. The computer system 50 including the memory controller 20 includes the flash memory 10 and a processor 51 controlling the operations of the flash memory 10.

The flash memory 10 may be implemented by a non-volatile memory such as a NAND flash memory. The computer system 50 also includes a system memory 52, a memory interface 53, an ECC block 54, and a host interface 55.

The computer system 50 includes the system memory 52 that may be used as an operation memory of the processor 51. The system memory 52 may be implemented by a non-volatile memory like read-only memory (ROM) or a volatile memory like SRAM.

A host (not shown) connected with the computer system 50 may perform data communication with the flash memory 10 through the memory interface 53 and the host interface 55.

The ECC block 54 may detect an error bit included in data output from the flash memory 10 through the memory interface 53, correct the error bit, and transmit the error-corrected data to the host through the host interface 55 according to the control of the processor 51. The processor 51 may control data communication among the memory interface 53, the ECC block 54, the host interface 55, and the system memory 52 through a bus 56.

The computer system 50 may be implemented, for example, as a flash memory drive, a USB memory drive, an interchip (IC)-USB memory drive, or a memory stick.

Figure 9:
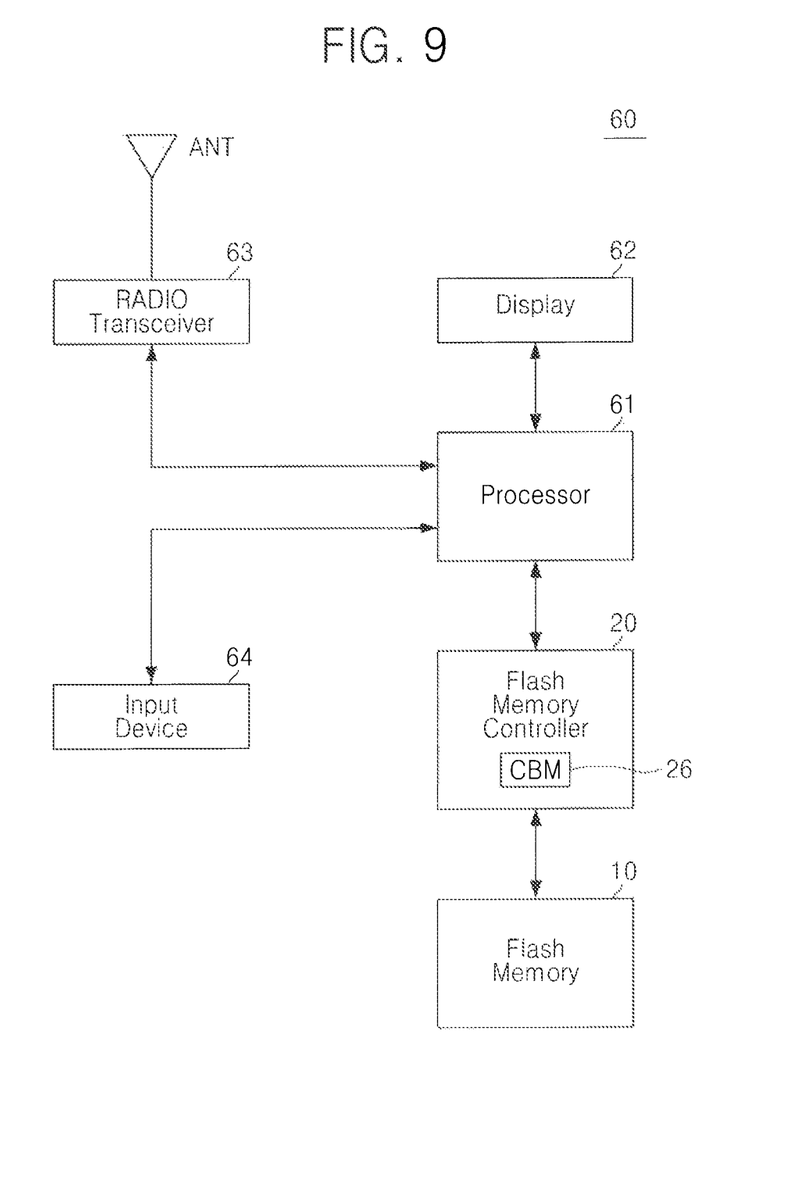
FIG. 9 is a diagram of a computer system including the memory controller illustrated in FIG. 1 according to an exemplary embodiment of the present general inventive concept.

FIG. 9 is a diagram of a computer system 60 including the memory controller 20 illustrated in FIG. 1 according to an exemplary embodiment of the present general inventive concept. Referring to FIG. 9, the memory controller 20 includes the combinational block manager 26. The computer system 60 including the memory controller 20 may be implemented, for example, as a cellular phone, a smart phone, a PDA, a smart pad, or a radio communication system.

The computer system 60 includes the flash memory 10 and the memory controller 20 controlling the operations of the flash memory 10.

The memory controller 20 may control the data access operation, e.g., an erase operation, a write operation, or a read operation, of the flash memory 10 according to the control of a processor 61. Data stored in the flash memory 10 may be displayed through a display 62 according to the control of the processor 61 and/or the memory controller 20.

A radio transceiver 63 may transmit or receive radio signals through an antenna ANT. The radio transceiver 63 may convert radio signals received through the antenna ANT into signals that can be processed by the processor 61. Accordingly, the processor 61 may process the signals output from the radio transceiver 63 and transmit the processed signals to the memory controller 20 or the display 62. The memory controller 20 may store the signals processed by the processor 61 in the flash memory 10.

The radio transceiver 63 may also convert signals output from the processor 61 into radio signals and output the radio signals to an external device through the antenna ANT. An input device 64 enables control signals for controlling the operation of the processor 61 or data to be processed by the processor 61 to be input to the computer system 60. The input device 64 may be implemented by a pointing device such as a touch pad or a computer mouse, a keypad, or a keyboard.

The processor 61 may control the operation of the display 62 to display data output from the memory controller 20, data output from the radio transceiver 63, or data output from the input device 64, through the display 62.

The memory controller 20, which controls the operations of the flash memory 10, may be implemented as a part of the processor 61 or as a separate chip.

Figure 10:
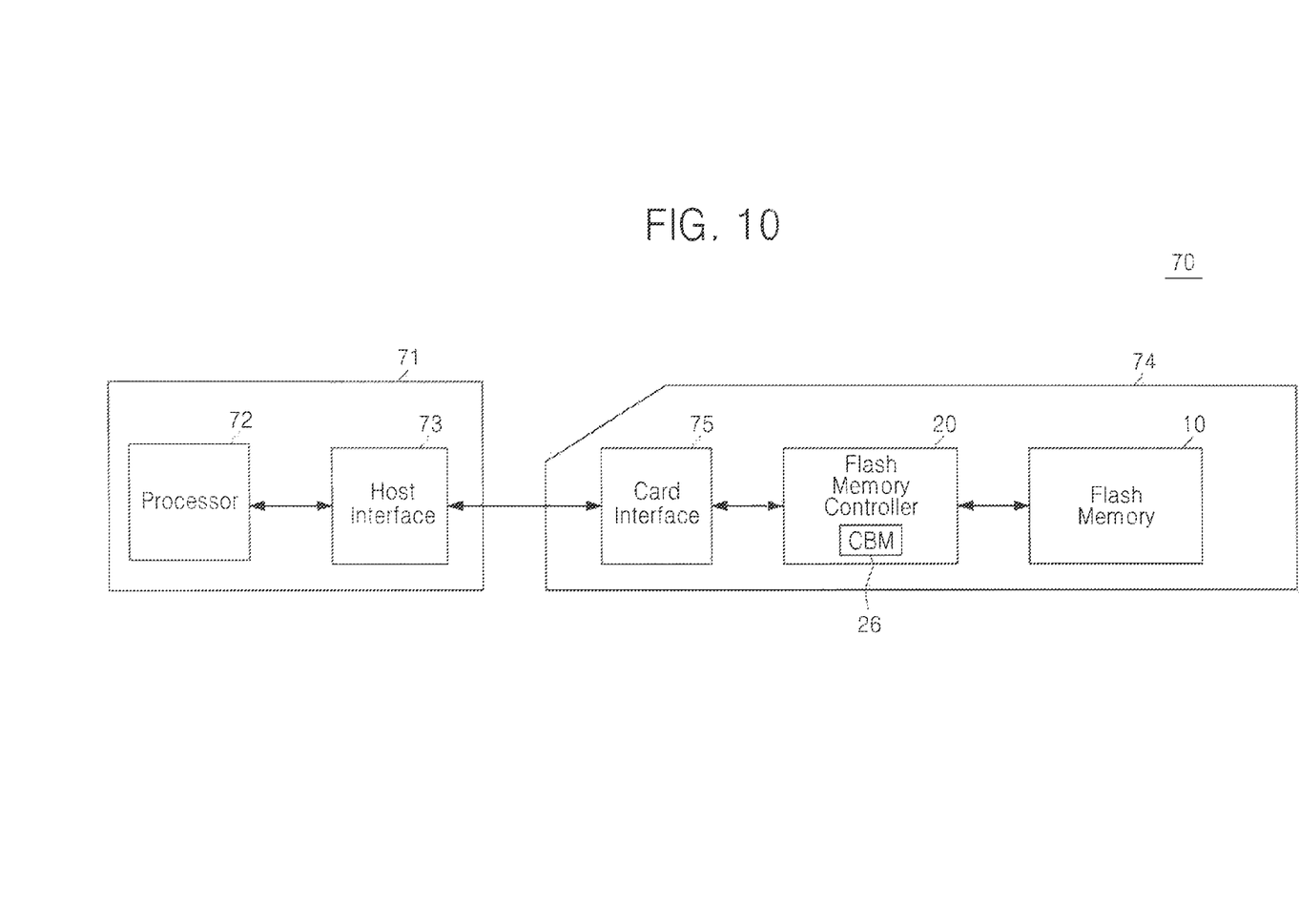
FIG. 10 is a diagram of a computer system including the memory controller illustrated in FIG. 1 according to an exemplary embodiment of the present general inventive concept.

FIG. 10 is a diagram of a computer system 70 including the memory controller 20 illustrated in FIG. 1 according to yet other embodiments of the present general inventive concept. Referring to FIG. 10, the memory controller 20 includes the combinational block manager 26. The computer system (or data processing system) 70 including the memory controller 20 includes a host computer 71 and a memory card 74. The memory card 74 may be, for example, a smart card.

The host computer 71 includes a host processor 72 and a host interface 73. The memory card 74 includes the flash memory 10, the memory controller 20, and a card interface 75. The memory controller 20 may control data exchange between the flash memory 10 and the card interface 75.

The card interface 75 may be, for example, a secure digital (SD) card interface, a multi-media card (MMC) interface, a subscriber identity module (SIM) card interface, or a universal subscriber identity module (USIM) card interface, but the present general inventive concept is not limited thereto.

When the memory card 74 is electrically connected with the host computer 71, the card interface 75 may interface the host processor 72 and the memory controller 20 for data exchange according to a protocol of the host processor 72.

The card interface 75 may support a USB protocol and an inter-chip-USB (IC-USB) protocol. Here, the card interface 75 may indicate a hardware supporting a protocol used by the host computer 71, a software installed in the hardware, or a signal transmission mode.

When the memory card 74 is connected with the host interface 73 of the host computer 71, such as, for example, a PC, a tablet PC, a digital camera, a digital audio player, a cellular phone, a console video game hardware, a digital set-top box, an automotive navigation system, or a car navigator, the host interface 73 may perform data communication with the flash memory 10 through the card interface 75 and the memory controller 20 according to the control of the host processor 72.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can be transmitted through carrier waves or signals (e.g., wired or wireless data transmission through the Internet). Also, functional programs, codes, and code segments to accomplish the present general inventive concept can be easily construed by programmers skilled in the art to which the present general inventive concept pertains.

As described above, according to some embodiments of the present general inventive concept, a memory controller logically combines a bad block with a good block and uses the combination, thereby expanding the life of non-volatile memory devices.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An operating method of a memory controller, the method comprising:
    classifying a plurality of blocks of a memory cell array included in a flash memory into a first group and a second group according to a number of error bits in data programmed to each of the plurality of blocks; and
    creating a combinational block by combining a first block from the first group with a second block from the second group.

2. The method of claim 1, further comprising:
    scrambling and programming data to be stored in the combinational block.

3. The method of claim 2, further comprising:
    descrambling and reading scrambled data from the combinational block.

4. The method of claim 1, further comprising:
    programming a part of first data to the first block of the combinational block and the remaining of the first data to the second block of the combinational block; and
    programming a part of second data to the first block of the combinational block and the remaining of the second data to the second block of the combinational block.

5. The method of claim 1, further comprising splitting the combinational block up when an average number of error bits per block in data stored in the combinational block exceeds a reference value.

6. A memory controller comprising:
    a processor configured to process information about a number of error bits in each of a plurality of blocks of a memory cell array included in a flash memory; and
    a combinational block manager configured to classify the plurality of blocks into a first group and a second group according to the information about the number of error bits in each of the plurality of blocks and to create a combinational block by combining a first block from the first group with a second block from the second group.

7. The memory controller of claim 6, further comprising:
    a flash management controller configured to control a program operation or a read operation of each of the blocks.

8. The memory controller of claim 7, wherein the processor controls the flash management controller to scramble and store data in the combinational block.

9. The memory controller of claim 7, wherein the processor controls the flash management controller to program a part of first data to the first block of the combinational block and the remaining of the first data to the second block of the combinational block and to program a part of second data to the first block of the combinational block and the remaining of the second data to the second block of the combinational block.

10. The memory controller of claim 6, wherein the combinational block manager splits the combinational block up when an average number of error bits per block in data stored in the combinational block exceeds a reference value.

11. The memory controller of claim 6, wherein the combinational block manager comprises:
    a grade determiner configured to classify the plurality of blocks into the first group and the second group according to the number of error bits in each of the plurality of blocks;
    a block selector configured to select the first block from the first group and the second block from the second group; and
    a combinational block creator configured to create the combinational block by combining the first block with the second block.

12. The memory controller of claim 6, wherein at least one of the first block and the second block is a bad block.

13. A solid state drive comprising:
    the memory controller of claim 6; and
    a solid state drive controller configured to control the memory controller.

14. The solid state drive of claim 13, further comprising:
    a flash management controller configured to control each of the blocks in the memory cell array included in the flash memory, and the processor controls the flash management controller to scramble and store data in the combinational block.

15. A memory card comprising:
    an interface; and
    the memory controller of claim 6, which is connected between the interface and the flash memory.

16. The memory card of claim 15, further comprising:
    a flash management controller configured to control a program operation or a read operation of each of the blocks, and the processor controls the flash management controller to scramble and store data in the combinational block.

17. A memory controller connectable to a memory including a plurality of memory blocks, the memory controller comprising:
    a block selector to select a first memory block having a number of error bits equal to or less than a predetermined value and to select a second memory block having a number of error bits greater than the predetermined value; and
    a combinational block creator to combine the first memory block and the second memory block to create a combinational memory block.

18. The memory controller of claim 17, further comprising:
    a combinational block error calculator to determine if the combinational memory block has an average number of error bits per block greater than the predetermined value.

19. The memory controller of claim 18, wherein if the combinational memory block has an average number of error bits per block greater than the predetermined value, the block selector selects a new first memory block having a number of error bits equal to or greater than the predetermined value and a new second memory block having a number of error bits less than the predetermined value, and the combinational block creator combines the new first memory block and the new second memory block to create a new combinational memory block.

20. The memory controller of claim 17, further comprising:
   an error correction code (ECC) block to correct errors in the plurality of memory blocks, wherein the predetermined value is based on a number of bits the ECC block is capable of correcting in a memory block.

* * * * *